United States Patent
Redpath et al.

(10) Patent No.: US 10,697,625 B1
(45) Date of Patent: Jun. 30, 2020

(54) ILLUMINATION APPARATUS HAVING THERMALLY ISOLATED HEAT SINKS AND DUAL LIGHT SOURCES

(71) Applicants: Richard Redpath; James Redpath, Cary, NC (US)

(72) Inventors: Richard Redpath, Cary, NC (US); James Redpath, Cary, NC (US)

(*) Notice: Subject to any disclaimer, the term of this patent is extended or adjusted under 35 U.S.C. 154(b) by 0 days.

(21) Appl. No.: 16/664,896

(22) Filed: Oct. 27, 2019

(51) Int. Cl.
| | | |
|---|---|---|
| *F21V 29/70* | (2015.01) | |
| *F21V 29/503* | (2015.01) | |
| *H05K 1/18* | (2006.01) | |
| *H05K 1/02* | (2006.01) | |
| *F21Y 115/10* | (2016.01) | |
| *F21V 5/00* | (2018.01) | |
| *F21Y 115/30* | (2016.01) | |

(52) U.S. Cl.
CPC ............ *F21V 29/503* (2015.01); *F21V 29/70* (2015.01); *H05K 1/0203* (2013.01); *H05K 1/181* (2013.01); *F21V 5/006* (2013.01); *F21Y 2115/10* (2016.08); *F21Y 2115/30* (2016.08); *H05K 2201/066* (2013.01); *H05K 2201/09027* (2013.01); *H05K 2201/09063* (2013.01); *H05K 2201/10106* (2013.01); *H05K 2201/10121* (2013.01)

(58) Field of Classification Search
CPC ...... F21V 23/005; F21V 29/503; F21V 29/70; F21L 14/023; F21L 4/02; F21L 4/025; F21L 4/027; H05K 1/0203; H05K 1/0212; H05K 1/0201
See application file for complete search history.

(56) References Cited

U.S. PATENT DOCUMENTS

| | | | | |
|---|---|---|---|---|
| 6,827,468 | B2* | 12/2004 | Galli | F21L 4/027 362/294 |
| 6,866,401 | B2* | 3/2005 | Sommers | F21V 14/065 362/268 |
| 7,726,844 | B2* | 6/2010 | Chen | F21V 29/763 362/294 |
| 7,780,315 | B2* | 8/2010 | Gasquet | F21S 48/215 362/294 |
| 7,806,574 | B2* | 10/2010 | Van Laanen | H01L 33/647 362/547 |
| 2004/0195947 | A1* | 10/2004 | Clark | F21V 29/70 313/46 |
| 2007/0279900 | A1* | 12/2007 | Bauer | H05B 45/00 362/158 |
| 2019/0140155 | A1* | 5/2019 | Kums | H01L 33/62 |
| 2019/0195484 | A1* | 6/2019 | Yamana | F21V 9/30 |

* cited by examiner

Primary Examiner — Ismael Negron

(57) ABSTRACT

An apparatus includes a light emitting diode (LED) chip; a laser light source; a front heat sink including first and second holes; a lens arranged to extend over the first hole; a back heat sink; and an insulating circuit board including a third hole, the circuit board sandwiched between the heat sinks such that the second hole and the third holes are aligned. The LED chip is mounted in a surface of the circuit board facing the front heat sink, and arranged such that it aligns with the first hole and the lens. The laser light source is provided in the back heat sink and arranged such that it extends at least partially through the second and third holes.

2 Claims, 3 Drawing Sheets

ILLUMINATION APPARATUS HAVING THERMALLY ISOLATED HEAT SINKS AND DUAL LIGHT SOURCES

FIELD OF THE INVENTION

The present invention relates to a compound heat sink useful for optimizing heat dissipation for forward dual light operation from electronic components. More particularly, the invention relates to thermal isolation of two different co-located light sources for heat dissipation for forward light operation of each.

BACKGROUND OF THE INVENTION

Today's modern flashlights and other portable lights employ a heat sink for the light source component such as the light-emitting diodes (LED). This heat sink removes an incredible amount of heat from a high-powered light source component. The light source component has limited space as to be positioned forward of the structure of the flashlight and adding a second light source component to the flashlight would have to share the heat dissipation component which is detrimental to one another light source component. More particularly, the dual light source is an LED and a laser. The LED operates at an extremely high heat operation with a heat sink, the laser operates at a low heat operation relative to the LED specification for a safe range. These light source components should not share a heat sink as the laser will have a short operation cycle to protect the laser component from damage.

Therefore, there is a need for a method and apparatus to isolate thermal dissipation of the two light sources while provides a heat sink for each.

DETAIL DESCRIPTIONS OF THE INVENTION

All illustrations of the drawings are for the purpose of describing selected versions of the present invention and are not intended to limit the scope of the present invention.

Figure 1:
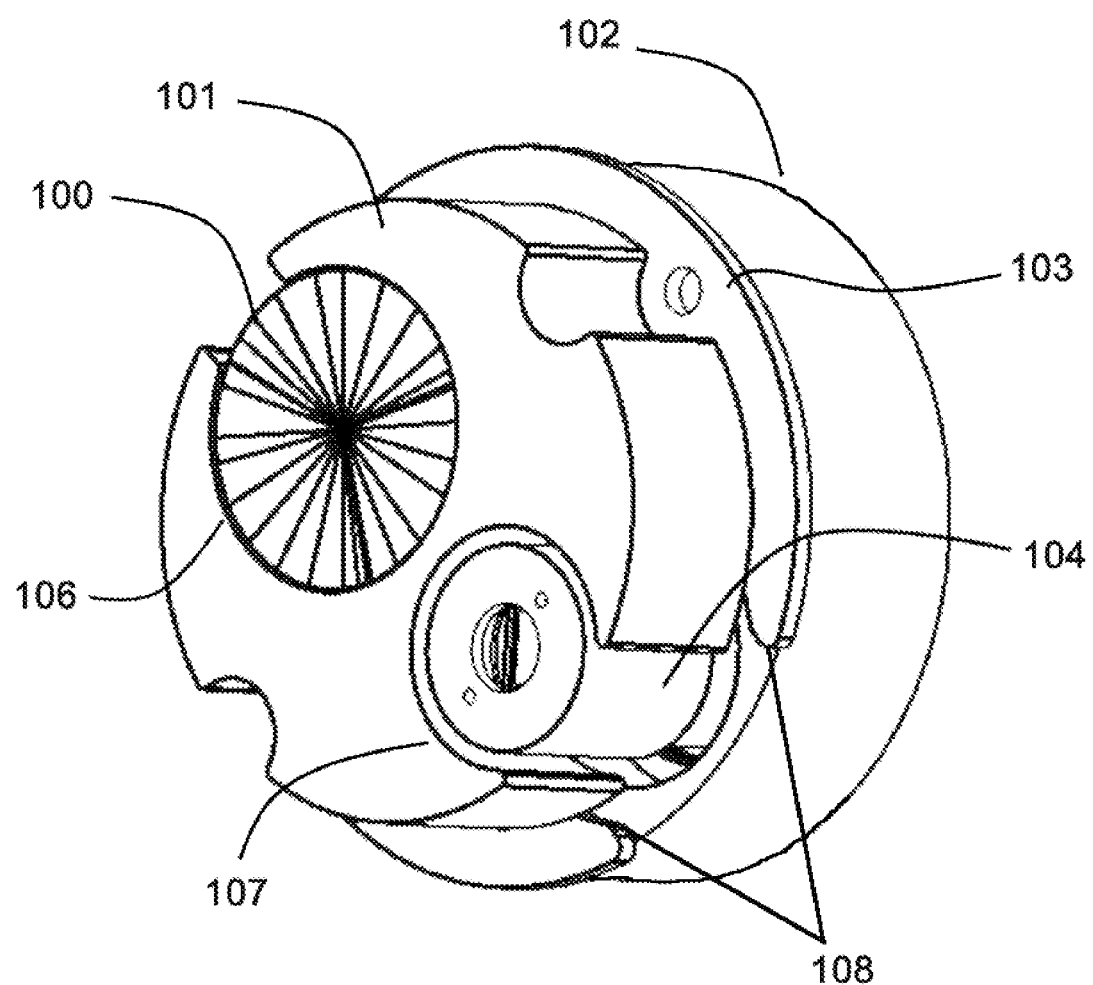
FIG. 1 is an assembled view of the embodiment for two co-located light sources

Referring to FIG. 1 an assembled view of the embodiment shows a laser light source 104, an LED light source with lens 100, and an insulating circuit board 103. The lens 100 is mounted onto a first hole 106 formed on front heat sink 101. A back heat sink 102 supports the laser light source 104. The circuit board 103 is sandwiched between the front heat sink 101 and the back heat sink 102, thereby thermally isolating the heat sinks 101 and 102 from each other. A second hole 107 formed on the front heat sink 101 aligns with the circuits board hole 108, such that the laser light source 104 extends at least through the second hole 107 and circuit board hole 108.

Figure 2:
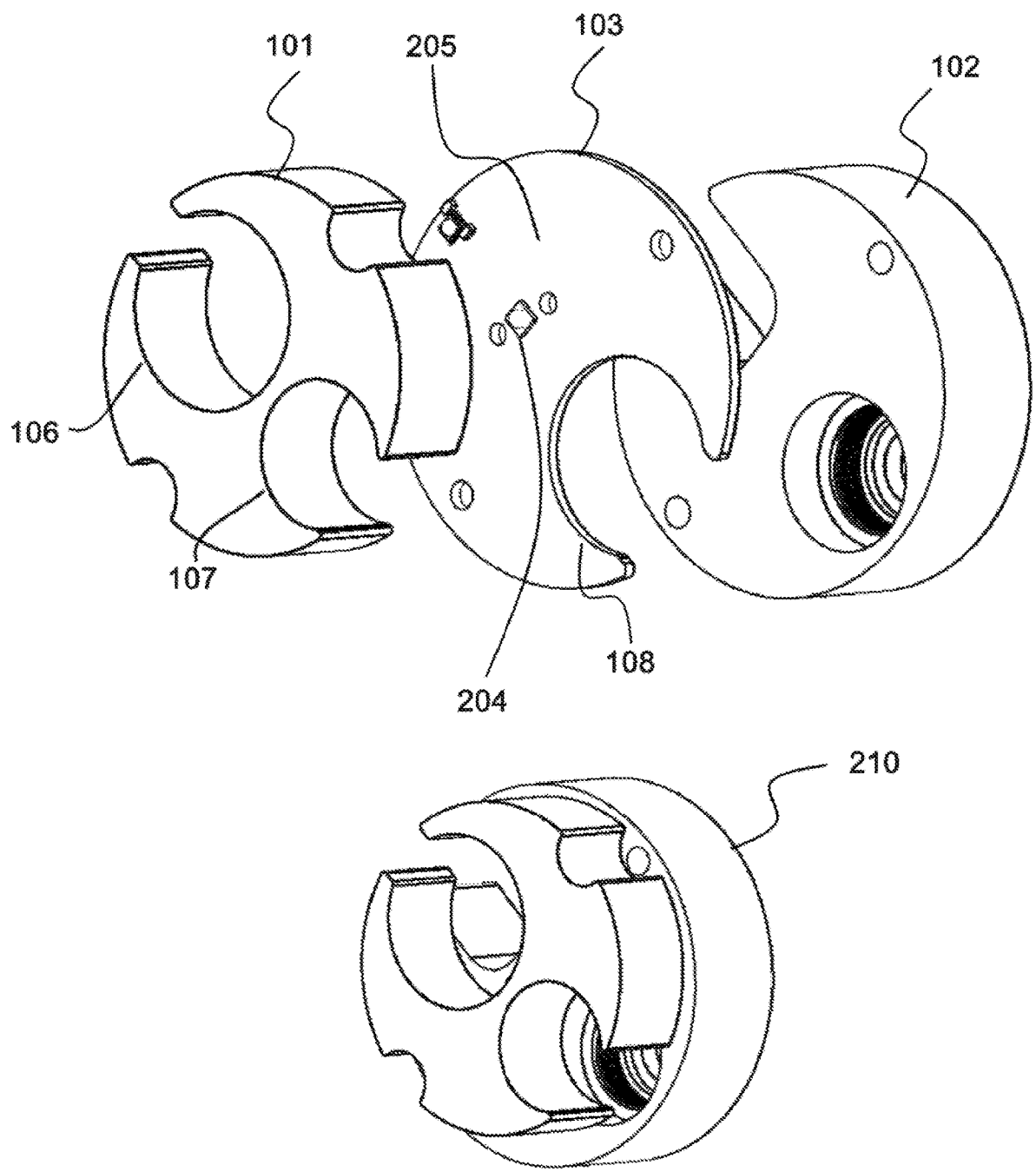
FIG. 2 is an exploded view and assembly of the method and apparatus for the compound heat sink.

Referring to FIG. 2 an exploded view of the apparatus an LED chip 204 is mounted on a surface 205 of the circuit board 103 to align with the first hole 106, such that light from the LED chip 204 reaches the LED lens 100. The front heat sink 101 mounts to the surface 205 of the circuit board 103. The circuit board 103 acts as an insulator between the back heat sink 102 and the LED chip 204 on the surface. The front heat sink 101 and back heat sink 102 with the circuit board 103 sandwiched between them form the assembly 210.

Figure 3:
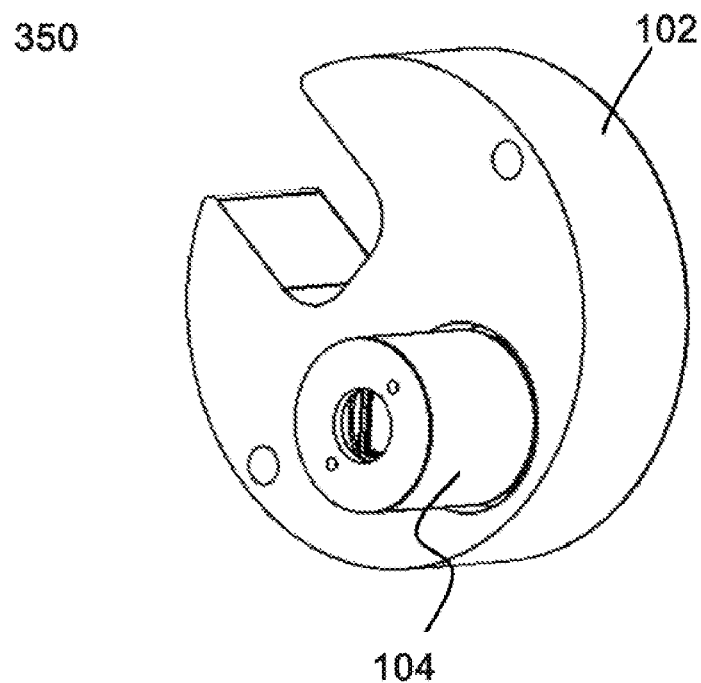
FIG. 3 is pictured the mounting of each light source to their respective component heat sinks.
Figure 3:
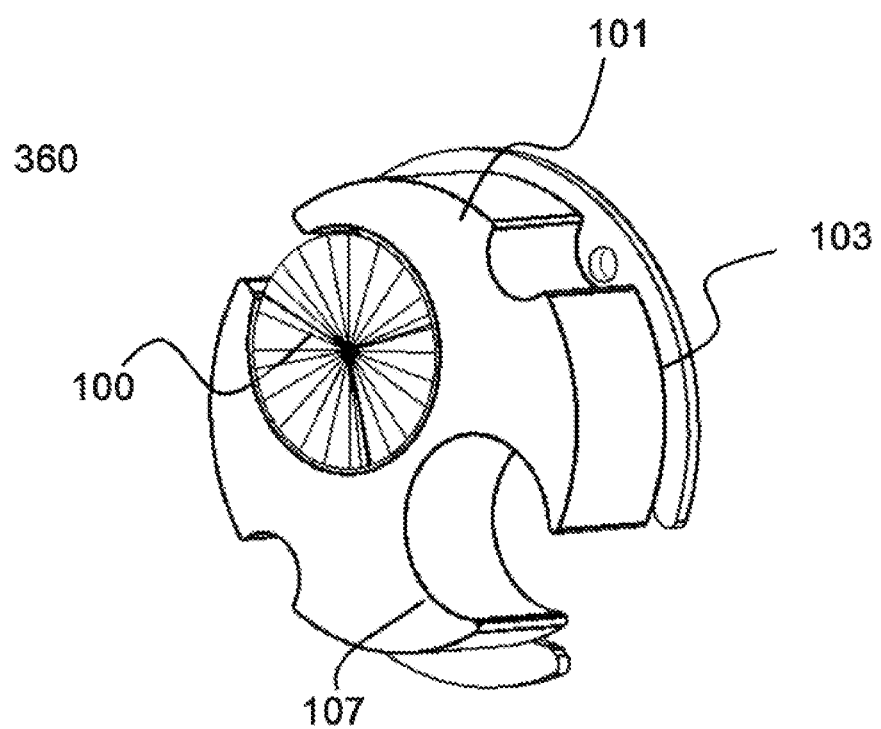

Referring to FIG. 3 the front heat sink 101 and the back heat sink 102 are shown. The laser light source 104 is mounted in the heat sink 102 to form a component 350. The circuit board 103 is attached to the front heat sink 101 to form a component 360.

Although the invention has been explained in relation to its preferred embodiment, it is to be understood that many other possible modifications and variations can be made without departing from the spirit and scope of the invention.

What is claimed is:

1. An apparatus comprising:
   at least one insulating plate including a first hole;
   a front heat sink having a second hole;
   a first electronic component mounted on the front heat sink;
   a back heat sink;
   a second electronic component mounted on the back heat sink;
   wherein the insulating plate is sandwiched between the front and back heat sinks, the first and second holes aligned such that the second electronic component can be seen through the first and second holes.

2. An Illumination apparatus comprising:
   at least one circuit board including a first hole;
   a first light source provided on the circuit board;
   a front heat sink having a second hole;
   a back heat sink;
   a second light source provided on the back heat sink;
   wherein the circuit board is sandwiched between the front and back heat sinks, the first and second holes aligned such that the second light source can be seen through the first and second holes.

* * * * *